United States Patent [19]

Turner et al.

[11] Patent Number: 5,145,531
[45] Date of Patent: Sep. 8, 1992

[54] FLUXING APPARATUS AND METHOD

[75] Inventors: Raymond L. Turner, La Habra; Randall L. Mays, Fullerton; Billy L. Montgomery, Whittier, all of Calif.

[73] Assignee: Hughes Aircraft Company, Los Angeles, Calif.

[21] Appl. No.: 608,042

[22] Filed: Oct. 31, 1990

[51] Int. Cl.$^5$ ............................................. B23K 35/34
[52] U.S. Cl. ...................................... 148/23; 228/41
[58] Field of Search ................................. 148/23-25; 228/41

[56] References Cited

U.S. PATENT DOCUMENTS 3,135,630  6/1964  Bielinski ................................. 148/25
4,191,577  3/1980  Buescher ............................... 148/24

Primary Examiner—Peter D. Rosenberg
Attorney, Agent, or Firm—Wanda K. Denson-Low

[57] ABSTRACT

Apparatus and methods for fluxing with water-soluble flux. A circuit card assembly has its solderable surface exposed for fluxing. A spray nozzle atomizes the flux to provide a mist that wets the surface without creating flux droplets. A pump is coupled between the spray nozzle and a container which stores the flux for pumping flux and atomizing the flux to create the flux spray. The apparatus may be used as a stand alone fluxing station for use with a liquid wave solder or vapor solder system. Alternatively, the apparatus may be used as an integral part of a wave soldering system that replaces the conventional fluxing station. In this embodiment, the apparatus is located beneath the conveyor and a sensor is used to actuate the flux spray. A plurality of nozzles or pluralities of sets of nozzles may be employed to achieve proper wetting of the assembly. One fluxing and soldering method comprises providing a water-based soldering flux, and atomizing the flux to create a mist that is sufficient to wet the solderable surfaces of the assembly. The assembly is soldered within about ten minutes of the fluxing operation. If wave soldering is used, the conveyor speed is set at twice the speed for soldering with conventional RMA flux. The soldered assembly is cleaned within about fifteen minutes of soldering operation using a surfactant diluted in about forty gallons of deionized water and heated to between about 150 and 160 degrees Fahrenheit. Finally, the assembly is rinsed using deionized water.

23 Claims, 3 Drawing Sheets

FLUXING APPARATUS AND METHOD

CROSS REFERENCE TO RELATED APPLICATIONS

The present application is related to copending U.S. patent application Ser. No. 523,765, filed May 15, 1990, entitled "Water-Soluble Soldering Flux", assigned to the assignee of the present invention, the contents of which are incorporated herein by reference.

BACKGROUND

The present invention relates generally to fluxing apparatus and methods, and more particularly to fluxing apparatus and methods that are adapted to dispense and apply water soluble soldering flux.

Conventional flux application apparatus for use in liquid wave soldering systems, for example, employs a flux bath that uses a stone having a plurality of perforations therein that is immersed in the flux. A chimney arrangement is disposed above the stone and air is forced through the stone. The forced air creates flux foam that bubbles up through the chimney to a point slightly above the top of the chimney.

A conveyor carries a circuit card assembly that is to be soldered along a path whereupon the flux bubbles coat the bottom surface of the circuit card assembly as the conveyor moves it over the chimney. The flux-coated circuit card assembly then passes through a preheater that elevates the temperature of the card and evaporates excess flux solvent from the bottom of the card. The circuit card assembly then is moved over a solder wave whereupon the circuit card assembly is soldered.

This conventional fluxing technique employs fluxing materials that must be cleaned and degreased by using highly toxic chemicals and hence creates an environmental disposal problem for the remnants of the chemicals employed. Most fluxes and defluxing chemicals used in the soldering industry contribute to ozone depletion of the atmosphere or are considered to be environmental pollutants or health hazards. Certain chlorofluorohydrocarbons used in vapor degreasing operations to clean soldered parts that were soldered with rosin-based fluxes, and alcohols, and the like pose health risks and disposal problems for the industry.

However, a recent advance in soldering fluxes has been achieved which is disclosed in U.S. patent application Ser. No. 523,765, filed on May 15, 1990, entitled "Water-Soluble Soldering Flux," and assigned to the assignee of the present invention. The contents of this application are incorporated herein by reference in its entirety. This water soluble flux is generally comprised of a water soluble organic acid, such as citric acid, and a non-toxic carrier such as water. The flux eliminates harmful environmental emissions normally associated with rosin-based fluxes, flux thinner, and defluxing solvents.

It is believed, that heretofore, solder flux, and in particular water soluable solder flux, has not been sprayed or misted onto surfaces of solderable components. Accordingly, it is an objective of the present invention to provide for fluxing apparatus and methods that are adapted to apply water soluble flux to circuit card assemblies, and the like.

SUMMARY OF THE INVENTION

In order to meet the above objective, the present invention provides for apparatus and methods for fluxing circuit card assemblies, and the like using the above described water-soluble flux. The solder flux, and in particular, the water soluable solder flux, is sprayed or misted onto surfaces of solderable components comprising a circuit card assembly that is to be soldered.

The fluxing apparatus comprises an enclosure having an opening therein which exposes the solderable surface of the circuit card assembly to the interior of the enclosure. Means for producing a mist or fog is provided, and in the preferred embodiment disclosed herein, at least one spray nozzle is disposed in the enclosure which atomizes the flux to provide a flux spray that is sufficient to wet the exposed surface of the circuit card assembly without creating flux droplets. A container is provided to store the water soluble flux therein. A pump or other transfer means is coupled between the spray nozzle and the container for pumping flux from the container to the spray nozzle and for atomizing the flux to create the flux spray.

The fluxing apparatus of the present invention may be employed as a stand alone fluxing station wherein circuit card assemblies are placed by hand or robot onto the enclosure and then are fluxed. The fluxed circuit card assembly then may be transferred to a liquid wave solder or vapor solder system for soldering. The present invention may be employed as an integral part of a wave soldering system that replaces the conventional fluxing station. In this alternative embodiment, the fluxing apparatus is located beneath the conveyor of the wave soldering system and a sensor system, for example, may be used to actuate the flux spray once the conveyor has moved the circuit card assembly to proper fluxing position. Once fluxed, the circuit card assembly is moved through the preheater and wave soldering stations of the system.

A plurality of nozzles or pluralities of sets of nozzles may be employed to achieve proper wetting of the solderable surfaces of the circuit card assembly. These nozzles may be tailored to provide different spray configurations from different locations in an array of nozzles, for example, and may be vertically and horizontally adjusted to achieve proper wetting profiles.

One method of fluxing and soldering a circuit card assembly in accordance with the principles of the present invention comprises the following steps. The first step is to provide a water-based soldering flux. The next step is to atomize the water-based soldering flux to create a fine mist that is sufficient to wet the solderable surfaces of the circuit card assembly. The next step is to solder the circuit card assembly within about ten minutes of the fluxing step. In the event that the soldering step involves wave soldering, the conveyor speed is set at twice the speed for soldering with conventional RMA flux, for example. The next step is to clean the soldered circuit card assembly within about fifteen minutes of soldering. This may be accomplished by using a surfactant, such as Triton X100, or the like, diluted in forty gallons of deionized water heated to between about 150 and 160 degrees Fahrenheit. Finally, the circuit card assembly is rinsed using deionized water.

BRIEF DESCRIPTION OF THE DRAWINGS

The various features and advantages of the present invention may be more readily understood with reference to the following detailed description taken in conjunction with the accompanying drawings, wherein like reference numerals disignate like structural elements, and in which.

DETAILED DESCRIPTION

Figure 1:
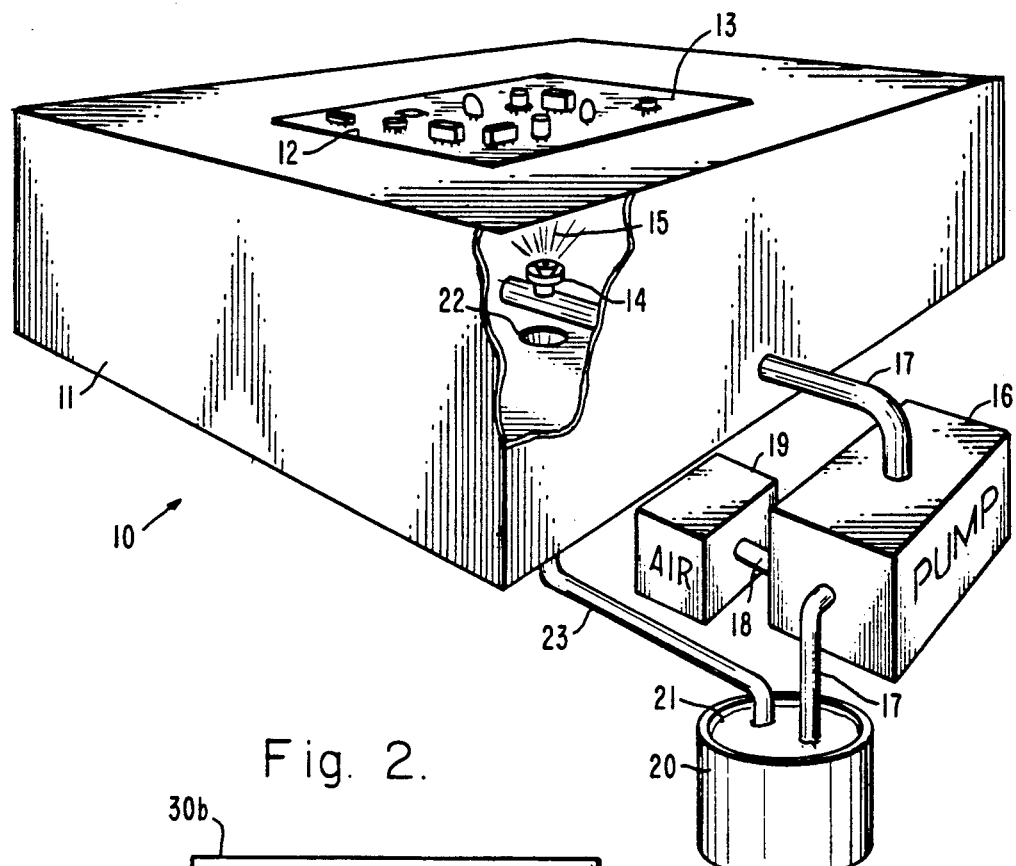
FIG. 1 illustrates a first embodiment of solder fluxing apparatus in accordance with the principles of the present invention.

Referring to the drawings, FIG. 1 illustrates a first embodiment of solder fluxing apparatus 10 in accordance with the principles of the present invention. The fluxing apparatus 10 includes an enclosure 11, which may comprise a stainless steel container, a polyvinylchloride (PVC) container, or a stainless container housed in a PVC container, for example. The enclosure 11 is made of a material that is resistant to corrosion and attack by chemicals comprising a water soluble flux 21. This water soluble flux 21 is non-corrosive and comprises a water soluble organic acid, such as citric acid, and a non-toxic carrier such as water. The composition and attributes of this flux 21 is described in detail in U.S. patent application Ser. No. 523,765, referenced above, the contents of which are incorporated herein by reference. The flux 21 is disposed within a container 20, which may be made of glass, for example.

In this first embodiment of the invention an opening 12 is provided in the top of the enclosure 11 that is appropriately sized to accept a circuit card assembly 13 that is to be fluxed and soldered. A spray nozzle 14 is disposed generally at the bottom of the enclosure 11 which has an exit orifice aimed at the opening in the enclosure 11. The spray nozzle 14 may be any conventional nozzle, such as those manufactured by Spraying Systems Company of Wheaton, Illinois, for example. However, the spray nozzle 14 is designed to provide a spray, fog, or mist 15 that atomizes the flux 21 such that the solderable surface of the circuit card assembly 13 is wet without causing the formation of an excessive number of droplets. A Paasche gun as it is known in the art may be adapted to provide a suitable mist 15.

A pump 16 is coupled to the spray nozzle 14 and by way of a flexible tube 17 to the container 20 that holds the flux 21, and by way of a tube 18 to a source of air 19. A simple air pump and nozzle arrangement may be employed to force air through the nozzle 14 which in turn sucks flux from the container 20 through the flexible tube 17 to create the spray mist 15. The type of pumping and air supply arrangement used in the present invention is not critical except that the mist supplied by the nozzle 14 must wet the circuit card assembly 13 without causing the formation of an excessive number of droplets thereon. Furthermore, any other apparatus suitable for providing a spray mist 15 or "fog" of solder flux may be adapted for use in the present invention, including vapor producing apparatus, and the like. A drain 22 is disposed in the bottom the the enclosure 11 and a flexible drain line 23 is coupled between the drain 22 and the flux container 20. This permits excess flux to be returned to the container 20 for possible further use.

In operation, the fluxing apparatus 10 of FIG. 1 employs a water-soluble flux 21 such as is designated "HF1189" flux available from Hughes Aircraft Company, Fullerton, Calif., and as is described in the above-cited and cross referenced patent application. For example, a single spray nozzle 14 (which is also known as a nozzle assembly) may be comprised of a fluid cap and an air cap. The fluid cap may be a model 2050 and the air cap may be a model 67-6-20-70° available from Spraying Systems Company. This spray nozzle 14 has an exit orifice size that is adapted to accept a flexible tube 17, ¼ inches in diameter that is coupled to the flux container 20, and an air tube 18, ¼ inches in diameter the coupled to a source of air 19. When the source of air 19 was set at an air pressure of 10 psi, a flux mist 15 was created that wet a circuit card assembly 13 without causing the formation of an excessive number of droplets thereon.

Figure 2:
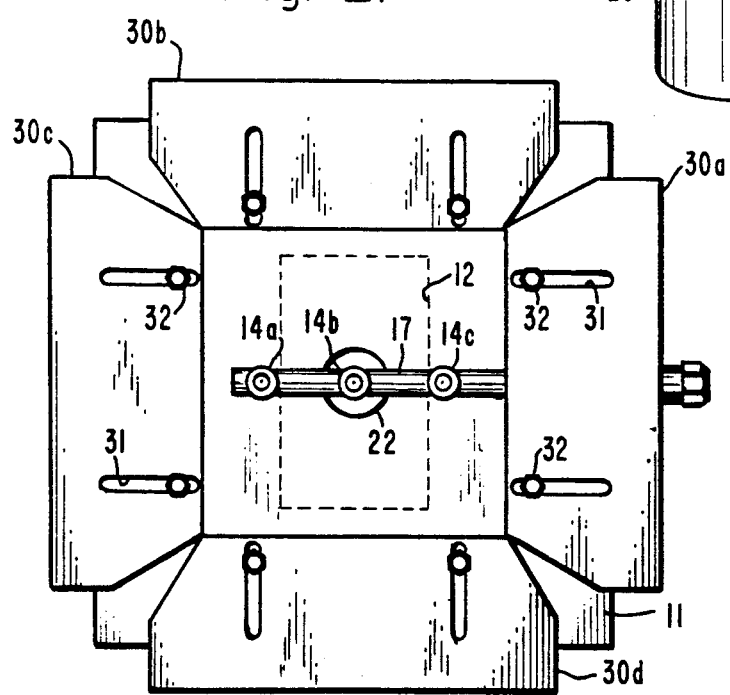
FIG. 2 illustrates the fluxing apparatus of FIG. 1 modified to permit fluxing of circuit card assemblies having varying dimensions.

Referring to FIG. 2, it illustrates the fluxing apparatus 10 of FIG. 1 modified to permit fluxing of circuit card assemblies 13 having varying dimensions. A variety of differently sized circuit card assemblies 13 may be fluxed using the fluxing apparatus 10 by incorporating pairs of sliding retainers 30a, 30b that slide orthogonal with respect to each other. The pairs of sliding retainers 30a, 30b may have slots milled therein through which are disposed wing nuts, for example which allow the retainers 30a, 30b to be secured in proper position hold a particular circuit card assembly 13.

As the sliding retainers 30a, 30b slide in and out with respect to the opposite member of the pair, this arrangement is adapted to hold circuit card assemblies 13 of various dimensions. The original opening 12 is shown in phantom for reference. In order to accommodate circuit card assemblies 13 of varying dimension, a plurality of nozzles 14a, 14b, 14c are shown disposed in the bottom the the enclosure 11. Each of the nozzles 14a, 14b, 14c each is configured to cause a mist of flux that wet any circuit circuit card assembly 13 without causing the formation of an excessive number of droplets thereon. This may be accomplished by inactivating certain ones of the nozzles 14 for small circuit card assemblies 13 and activating and modifying the spray profile on selected ones of the nozzles 14 for larger circuit card assemblies 13. Such tailoring of spray profiles is well known in the art and will not be described in detail herein.

Figure 3:
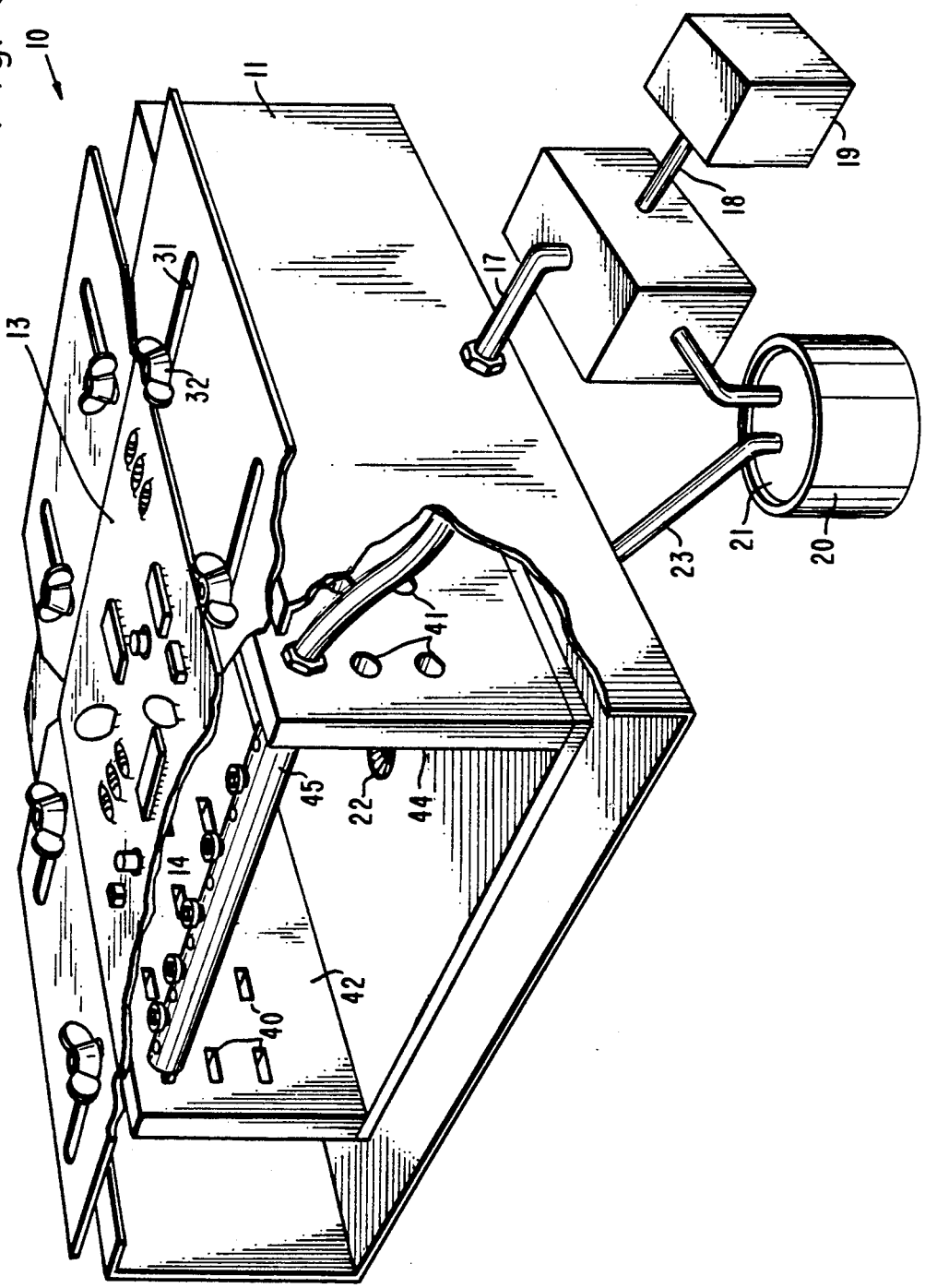
FIG. 3 illustrates the fluxing apparatus of FIG. 1 modified to incorporate a plurality of spray nozzles that are adjustable in position.

FIG. 3 illustrates the fluxing apparatus of FIG. 1 modified to incorporate a plurality of sets spray nozzles 14 that are adjustable in position. A plurality of rectangular slots 40 are disposed in one sidewall 42 of the enclosure 11 while a plurality of holes 41 are located in the opposite sidewall 44. A cylindrical manifold 45 into which is secured a number of nozzles 14 is disposed between corresponding slot and hole pairs in order to provide an array of nozzles 14 that spray or fog the circuit card assembly 13. As should be clear, several manifolds may be simultaneously employed to obtain a sufficient misting to meet the objectives of the present invention. These may be adjusted appropriately for any size circuit card assembly 13 by selecting an appropriate mist profile and nozzle location.

Figure 4:
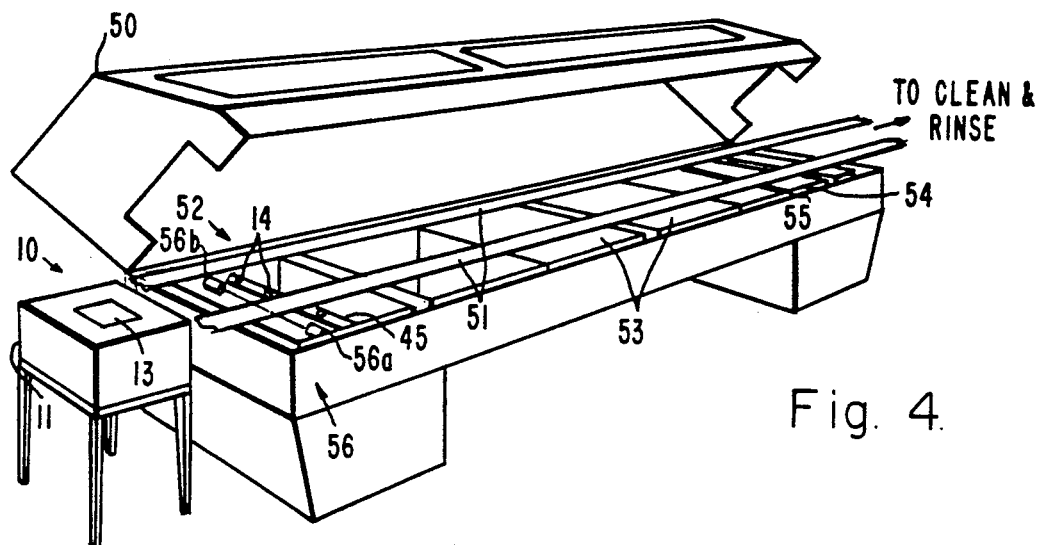
FIG. 4 illustrates a liquid wave soldering system incorporating two alternative embodiments of the present invention therein.

FIG. 4 illustrates a liquid wave soldering system 50 incorporating two alternative embodiments of the present invention for use therewith. The liquid wave soldering system 50 includes a conveyer 51, a fluxing station 52 a preheating station 53 and a solder wave station 54. The conveyor 51 moves a circuit card assembly 13 through the system 50 at a predetermined rate of speed. In the first embodiment, the fluxing apparatus 10 is disposed outside of the liquid wave soldering system 50 adjacent the front end of the conveyor 51. The circuit card assembly 13 is manually, automatically, or by means of a robot (not shown), for example, placed onto the fluxing apparatus 10 for fluxing. Once fluxed, the circuit card assembly 13 is moved onto the conveyor 51 and is transported through the preheating and soldering wave stations 53, 54, which moves the assembly 13 through a solder wave 55, and thereafter it removed from the liquid wave soldering system 50 for cleaning, as will be discussed with reference to FIG. 5 below. In this first embodiment, the normal fluxing station 52 of the wave soldering system 50 is not employed.

In a second embodiment of the liquid wave soldering system 50, also illustrated in FIG. 4, the conventional fluxing station 52 is replaced by the fluxing apparatus 10a of the present invention. In this embodiment, the fluxing apparatus 10a comprises an enclosure 11 that has a nozzle 14, or plurality of nozzles 14 disposed in the bottom thereof. In the embodiment shown in FIG. 4, a manifold 45 is used to couple air and flux 21 (not shown) to the plurality of nozzles 14. The plurality of nozzles 14 are adapted to spray the mist of flux 21 (not shown) on demand when the circuit card assembly 13 is in a proper position. A conventional or modified chimney may also be employed with the plurality of nozzles 14 in order to further control the spray pattern produced thereby. To accomplish this a sensor system 56 comprising a light source 56a and a detector 56b, for example may be employed. Alternatively, a laser light source may be used. The location of the sensor system 56 is chosen in conjunction with the speed of the conveyor to trigger the spray of flux 21 (not shown). This may be accomplished in a routine manner by those skilled in the art.

Figure 5:
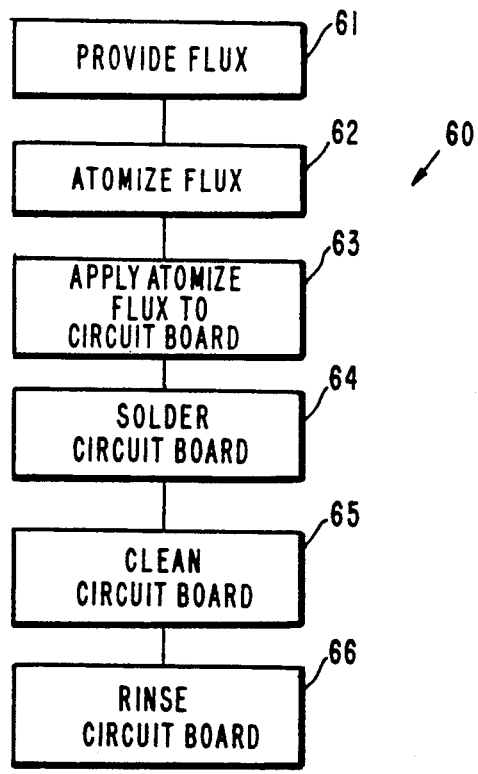
FIG. 5 shows a flow chart illustrating one method of fluxing, soldering and cleaning circuit card assemblies in accordance with the present invention.

The final procedure in obtaining a completed circuit card assembly 13 is to clean the soldered circuit card assembly 13. The steps in one method 60 of fluxing, soldering and cleaning a circuit card assembly 13 fluxed using the water-soluble flux 21 and soldered in accordance with the above teachings comprises the following. This method is depicted in FIG. 5, which shows a flow chart illustrating the steps of cleaning circuit card assemblies fluxed and soldered using the fluxing apparatus 10, 10a of the present invention. The first step 61 is to provide a water-soluble flux 21. The next step 62 is to atomize the water-soluble flux 21 to create a fine mist that is sufficient to wet the solderable surfaces of the circuit card assembly 13. The next step 63 is to apply the atomized flux to the circuit card assembly 13. The next step 64 is to solder the circuit card assembly 13 within about ten minutes of the fluxing step. In the event that the soldering step involves wave soldering, the conveyor speed is set at twice the speed for soldering with conventional RMA flux, for example. The next step 65 is to clean the soldered circuit card assembly 13 within about fifteen minutes of soldering. This may be accomplished by using a surfactant, such as Triton X100, or the like, diluted in about forty gallons of deionized water heated to between about 150 and 160 degrees Fahrenheit. In the final step 66, the soldered circuit card assembly 13 is rinsed using deionized water.

Thus there has been described a new and improved fluxing apparatus and methods that are adapted to dispense and apply water soluble soldering flux. It is to be understood that the above-described embodiments are merely illustrative of some of the many specific embodiments which represent applications of the principles of the present invention. Clearly, numerous and other arrangements can be readily devised by those skilled in the art without departing from the scope of the invention. For example, a fog could be generated by means other that a spray nozzle, such as the for or vapor cloud that is generated in vapor phase soldering.

What is claimed is:

1. Apparatus for applying water soluble flux to a circuit card assembly comprising:
    an enclosure having an opening therein adapted to provide a means for exposing a surface of the circuit card assembly to the interior thereof;
    flux misting means coupled to the enclosure for providing a flux mist that is sufficient to wet the exposed surface of the circuit card assembly;
    a container adapted to store water soluble flux therein;
    transferring means coupled to the flux misting means and the container for transferring flux from the container to the flux misting means.

2. The fluxing apparatus of claim 1 wherein the transferring means comprises pump means coupled between the flux misting means and the container for pumping flux from the container to the flux misting means.

3. The fluxing apparatus of claim 2 further comprising drain means coupled to the enclosure and to the container for draining the enclosure of excess flux.

4. The fluxing apparatus of claim 3 wherein the flux misting means comprises a spray nozzle coupled to the pump means.

5. The fluxing apparatus of claim 4 which further comprises a plurality of spray nozzles coupled to a manifold, which manifold is coupled to the pump means, and wherein each of the plurality of spray nozzles is individually adjustable to provide a spray having a predetermined spray pattern.

6. The fluxing apparatus of claim 1 comprising a plurality of sets of spray nozzles coupled to individual manifolds.

7. The fluxing apparatus of claim 6 wherein each of the plurality of spray nozzles is individually adjustable to provide a mist in the form of a spray having a predetermined spray pattern.

8. The fluxing apparatus of claim 1 further comprising means for adjustably securing the circuit card assembly in the opening in the enclosure.

9. The fluxing apparatus of claim 1 further comprising wave soldering apparatus comprising an adjustable conveyor adapted to move the circuit card assembly past the fluxing apparatus at a predetermined rate of speed, preheater means disposed adjacent the fluxing apparatus for preheating the fluxed circuit assembly, and a liquid solder wave disposed adjacent the preheater means for applying solder to the fluxed and preheated circuit card assembly.

10. The fluxing apparatus of claim 9 further comprising sensor means disposed adjacent the conveyor for sensing the location of the circuit card assembly on the conveyor and for actuating the fluxing apparatus to cause the spray nozzle to spray solder flux onto the surface of the circuit card assembly.

11. Fluxing apparatus for use with wave soldering apparatus that comprises an adjustable conveyor adapted to move a circuit card assembly at a predetermined rate of speed, preheater means for preheating a fluxed circuit assembly, and a liquid solder wave disposed adjacent the preheater means for applying solder to the fluxed and preheated circuit card assembly, wherein the improvement comprises:

an enclosure having an opening therein adapted to provide a means for exposing a surface of the circuit card assembly to the interior thereof;

a spray nozzle disposed in the enclosure adapted to provide a flux spray that is sufficient to wet the exposed surface of the circuit card assembly;

a container adapted to store water soluble flux therein;

pump means coupled to the spray nozzle and the container for pumping flux from the container to the spray nozzle and for creating the flux spray.

12. The fluxing apparatus of claim 11 further comprising drain means coupled to the enclosure and to the container for draining the enclosure of excess flux.

13. The fluxing apparatus of claim 11 comprising a plurality of spray nozzles coupled to a manifold, and whereupon the manifold is coupled to the pump means.

14. The fluxing apparatus of claim 13 wherein each of the plurality of spray nozzles is individually adjustable to provide a spray having a predetermined spray pattern.

15. The fluxing apparatus of claim 11 comprising a plurality of sets of spray nozzles coupled to individual manifolds.

16. The fluxing apparatus of claim 15 wherein each of the plurality of spray nozzles is individually adjustable to provide a spray having a predetermined spray pattern.

17. Apparatus for applying water soluble flux to a circuit card assembly comprising:

holding means for exposing a surface of the circuit card assembly for fluxing;

a container adapted to store water soluble flux therein;

flux misting apparatus coupled to the holding means for providing a flux mist that is sufficient to wet the exposed surface of the circuit card assembly without producing solder flux droplets thereon, said flux misting apparatus comprising a mainfold and at least one spray nozzle that is adapted to produce the flux mist;

pumping apparatus coupled to a source of pressurized air, to the flux misting apparatus, and to the container, for pumping water soluble flux from the container to the flux misting means and for forcing a mixture of flux and air through the mainfold and spray nozzle to produce the flux mist.

18. A method of fluxing, soldering and cleaning a circuit card assembly that comprises the steps of:

providing a water-based soldering flux;

atomizing the water-based soldering flux to create a fine mist that is sufficient to wet the solderable surfaces of the circuit card assembly;

applying the atomized flux to the solderable surfaces of the circuit card assembly to flux the assembly;

soldering the circuit card assembly within about ten minutes of the fluxing step;

cleaning the soldered circuit card assembly within about fifteen minutes of the soldering step; and rinsing the circuit card assembly using deionized water.

19. The method of claim 18 wherein the aqueous cleaning step comprises the step of using deionized water heated to between about 150 and 160 degrees Fahrenheit.

20. The method of claim 18 wherein the aqueous cleaning step comprises the step of using a surfactant diluted in about forty gallons of deionized water and heated to between about 150 and 160 degrees Fahrenheit.

21. The method of claim 20 wherein the surfactant comprises Triton X100.

22. The method of claim 18 which comprises the use of a liquid wave soldering apparatus comprising a conveyor adapted to move the circuit card assembly, and wherein the conveyor speed is set at twice the speed for soldering using conventional RMA flux.

23. A method of fluxing, soldering and cleaning a circuit card assembly that comprises the steps of:

providing a water-based soldering flux;

atomizing the water-based soldering flux to create a fine mist that is sufficient to wet the solderable surfaces of the circuit card assembly;

applying the atomized flux to the solderable surfaces of the circuit card assembly to flux the assembly;

soldering the circuit card assembly within about ten minutes of the fluxing step;

cleaning the soldered circuit card assembly within about fifteen minutes of the soldering step using deionized water heated to between about 150 and 160 degrees Fahrenheit; and rinsing the circuit card assembly using deionized water.

* * * * *